United States Patent
Arvin et al.

(10) Patent No.: US 9,804,498 B2
(45) Date of Patent: Oct. 31, 2017

(54) FILTERING LEAD FROM PHOTORESIST STRIPPING SOLUTION

(71) Applicant: INTERNATIONAL BUSINESS MACHINES CORPORATION, Armonk, NY (US)

(72) Inventors: Charles L. Arvin, Poughkeepsie, NY (US); Harry D. Cox, Rifton, NY (US); Arthur G. Merryman, Hopewell Junction, NY (US); Jennifer D. Schuler, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 14/299,444

(22) Filed: Jun. 9, 2014

(65) Prior Publication Data
US 2015/0352476 A1  Dec. 10, 2015

(51) Int. Cl.
 *G03F 7/42* (2006.01)
 *H01L 21/311* (2006.01)
 *B01D 39/12* (2006.01)

(52) U.S. Cl.
 CPC ........ *G03F 7/422* (2013.01); *H01L 21/31133* (2013.01); *B01D 39/12* (2013.01)

(58) Field of Classification Search
 CPC ........ B01D 39/06; B01D 39/12; B01D 39/10; B01D 39/2041; B01D 39/2031; B01J 20/0251; G03F 7/422; H01L 21/31133; H01L 2224/05116; H01L 21/02041–21/02101
 See application file for complete search history.

(56) References Cited

U.S. PATENT DOCUMENTS

| 3,391,024 | A | * | 7/1968 | Pierce | C23C 14/025 216/20 |
| 3,425,813 | A | * | 2/1969 | Orlemann | B22F 1/025 419/35 |
| 5,022,991 | A | * | 6/1991 | Day | C22B 9/023 210/506 |

(Continued)

FOREIGN PATENT DOCUMENTS

JP  2004055629 A  2/2004

OTHER PUBLICATIONS

Arita JP 2004055629 A JPO machine translation.*
(Continued)

*Primary Examiner* — David C Mellon
*Assistant Examiner* — Liam Royce
(74) *Attorney, Agent, or Firm* — Matthew C. Zehrer

(57) ABSTRACT

A photoresist stripping tool includes a reservoir configured to contain photoresist stripping solution and a Pb filter comprising a filter element with Tin (Sn) exterior surfaces. A semiconductor wafer fabrication system includes a semiconductor wafer attached to the photoresist stripping tool that strips photoresist from the semiconductor wafer. A photoresist stripping processes includes stripping photoresist from a leaded semiconductor wafer with photoresist stripping solution within the photoresist stripping tool, filtering Lead Pb from the photoresist stripping solution with the Pb filter, and stripping photoresist from a lead-free semiconductor wafer with the filtered photoresist stripping solution.

20 Claims, 4 Drawing Sheets

(56) References Cited

U.S. PATENT DOCUMENTS

| | | | | |
|---|---|---|---|---|
| 6,006,829 | A | * | 12/1999 | Whitlock ............... B01D 29/15 166/228 |
| 6,055,995 | A | * | 5/2000 | Miyazawa ................ B08B 3/10 134/109 |
| 6,436,276 | B1 | * | 8/2002 | Yakobson ................. C25F 5/00 205/674 |
| 2008/0157395 | A1 | * | 7/2008 | Belanger ................ H01L 24/03 257/778 |
| 2011/0186989 | A1 | * | 8/2011 | Hsiao ................ H01L 21/76885 257/737 |
| 2012/0152752 | A1 | * | 6/2012 | Keigler .................... C25D 5/02 205/118 |

OTHER PUBLICATIONS

Wellman et.al. "Synthesis of Organically Templated Nanoporous Tin(Ii/Iv) Phosphate for Radionuclide and Metal Sequestration" Inorg. Chem. 2006, 45, 2382-2384.*

* cited by examiner

FILTERING LEAD FROM PHOTORESIST STRIPPING SOLUTION

FIELD

Embodiments of invention generally relate to the fabrication of semiconductor devices. More particularly, embodiments relate to removing lead from a photoresist stripping solution utilized in the fabrication of a semiconductor wafer.

BACKGROUND

Formation of integrated circuit structures upon a semiconductor wafer may require photoresist patterning and subsequent electroplating processes. During electroplating, a metal or other electrically conductive material is plated from the wafer surface within the openings of the patterned photoresist. In certain implementations the electrically conductive material take the form of solder bumps utilized in controlled collapse chip connection (C4) to interconnect a semiconductor device to external circuitry via the solder bumps. Subsequent to plating, the photoresist is stripped from the semiconductor wafer utilizing a photoresist stripping solution.

The Restriction of Hazardous Substances Directive (RoHS) restricts the use of certain hazardous substances in electrical and electronic equipment and has driven the electronics industry to move away from solders that contain Lead (Pb). As a result, lead-free solder bumps may now be electroplated upon a lead-free semiconductor wafer within the patterned photoresist. In some instances, the photoresist upon the lead-free wafer may be stripped in the same photoresist stripping tool and photoresist stripping solution as leaded (non lead-free) semiconductor wafers.

SUMMARY

In an embodiment of the present invention, a photoresist stripping tool includes a reservoir configured to contain photoresist stripping solution and a Pb filter comprising a filter element with Tin (Sn) exterior surfaces.

In another embodiment of the present invention, a semiconductor wafer fabrication system includes a semiconductor wafer attached to a photoresist stripping tool that strips photoresist from the semiconductor wafer, the a photoresist stripping tool comprising the reservoir that contains photoresist stripping solution and the Pb filter comprising the filter element with Sn exterior surfaces.

In another embodiment of the present invention, a photoresist stripping processes includes stripping photoresist from a leaded semiconductor wafer with photoresist stripping solution comprised within a photoresist stripping tool, filtering Lead Pb from the photoresist stripping solution with a Pb filter comprising the filter element with Sn exterior surfaces, and stripping photoresist from a lead-free semiconductor wafer with the filtered photoresist stripping solution.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to semiconductor devices, such as a semiconductor wafer utilized in the production of a semiconductor chip. The wafer may include a layer of semiconductor material, such as a silicon crystal, utilized in the fabrication of integrated circuits and other microdevices. The wafer typically serves as the substrate for microelectronic devices built in and over the wafer and undergoes many microfabrication process steps such as doping or ion implantation, etching, deposition of various materials, and photolithographic patterning. The individual microcircuits may be separated and packaged resulting in a chip.

The chip may be planar device and may comprise planar electrodes in parallel planes, made by alternate diffusion of p- and n-type impurities into the semiconductor substrate of the chip. Alternatively, the chip may be a FinFET type device and may comprise a plurality of fins formed from or upon the semiconductor substrate and a gate covering a portion of the fins. The portion of the fins covered by the gate may serve as a channel region of the device. Portions of the fins may also extend out from under the gate and may serve as source and drain regions of the device.

Referring now to the FIGs, wherein like components are labeled with like numerals, exemplary embodiments that involve a semiconductor device, such as a wafer, chip, integrated circuit, microdevice, etc. in accordance with embodiments of the present invention are shown, and will now be described in greater detail below. It should be noted that while this description may refer to components of the semiconductor device in the singular tense, more than one component may be depicted throughout the figures and within the semiconductor device. The specific number of components depicted in the FIGS and the cross section orientation was chosen to best illustrate the various embodiments described herein.

Figure 1:
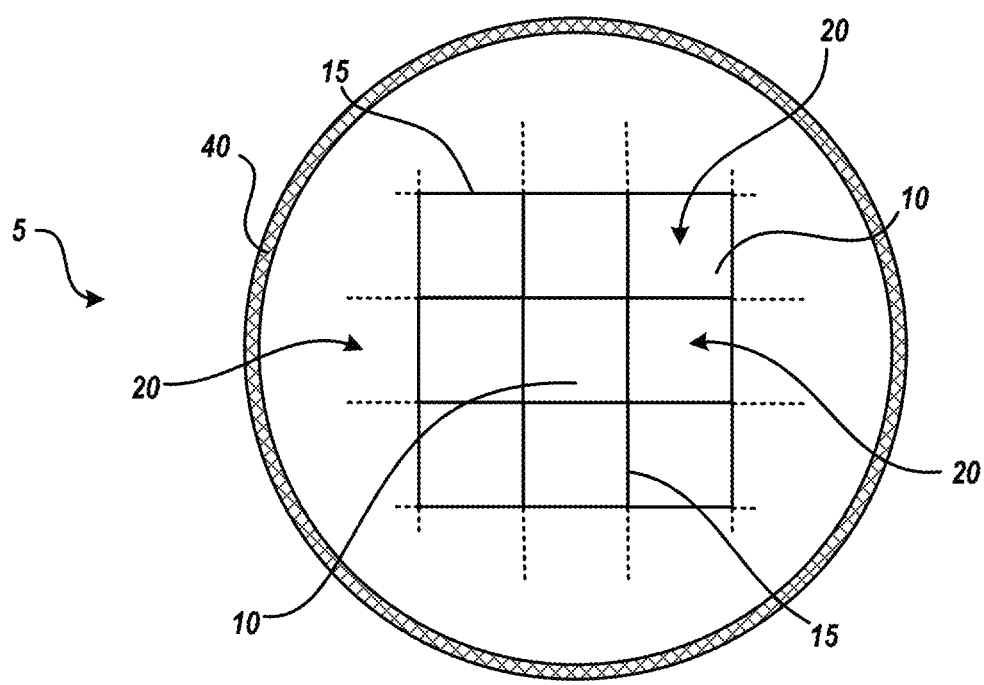
FIG. 1 depicts a semiconductor wafer, in accordance with various embodiments of the present invention.

FIG. 1 depicts a semiconductor wafer 5, in accordance with various embodiments of the present invention. Wafer 5 may include a plurality of chips 10 separated by kerfs 15. Each chip 10 may include an active region 20 wherein integrated circuit devices, microelectronic devices, etc. may be built using microfabrication process steps such as doping or ion implantation, etching, deposition of various materials, photolithographic patterning, electroplating, etc. Wafer 5 may also includes a perimeter edge region 40 that is free of photoresist material where an electrodeposition tool electrically contacts wafer 5 to enable electrodeposition.

Figure 2:
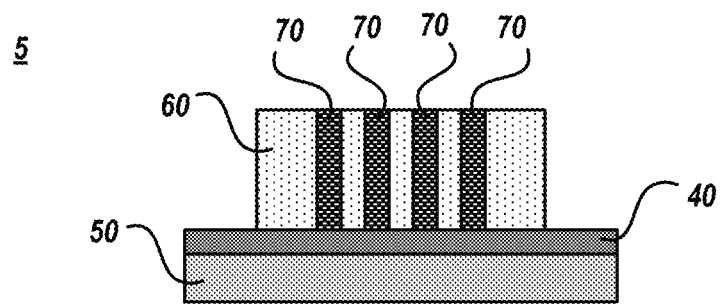
FIG. 2 depicts a cross section view of a semiconductor wafer at intermediate stages of fabrication, in accordance with various embodiments of the present invention.

FIG. 2 depicts a cross section view of semiconductor wafer 5 at an intermediate stage of fabrication, in accordance with various embodiments of the present invention. At the present stage of fabrication, wafer 5 may include a semiconductor substrate 50, a shorting layer 40, patterned photoresist 60, and plating structures 70.

The semiconductor substrate 50 may include, but is not limited to: any semiconducting material such conventional Si-containing materials, Germanium-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), annealed poly Si, and poly Si line structures. In various embodiments, substrate 50 may be, for example, a layered substrate (e.g. silicon on insulator), a bulk substrate, a planar device substrate, etc. The substrate 50 may include back end of the line micro devices, front end of the line micro devices, middle of the line micro devices, wiring layers, etc. formed within or thereupon.

The shorting layer 40 is an electrically conductive layer that may be formed upon the substrate 50 using a sputtering technique or other known deposition technique. In embodiments, the shorting layer 40 may be, for example, copper or other conductive metal such as, for example, nickel, nickel alloys, copper alloys, etc. The shorting layer 40 may be multilayered and also include a barrier layer which may be, for example, Ti, Ti Tungsten, or Ti Tungsten Chrome. The shorting layer 40 may be about 0.45 microns thick; although other dimensions are also contemplated by the present invention such as, for example, a range of about between 0.1 to 0.6 microns. In certain embodiments, shorting layer 40 is utilized as a shorting layer where the electrodeposition tool electrically contacts wafer 5 to enable electrodeposition or formation of plating structures 70.

Photoresist layer 60 is generally a light-sensitive material that may be patterned formed upon the shorting layer 40. Photoresist layer 60 may be applied as a liquid upon shorting layer 40 that may dry and be patterned generally forming a pattern upon substrate 50. Liquid photoresist may be formed by precision spraying, roller coating, dip coating, spin coating, etc. Exemplary liquid photoresists can be either positive tone resists such as TCIR-ZR8800 PB manufactured by Tokyo Ohka Kogyo America, Inc. or negative tone resists such as JSR THB 126N manufactured by JSR Micro, Inc., Poly(methyl methacrylate) (PMMA), Poly(methyl glutarimide) (PMGI), Phenol formaldehyde resin (DNQ/Novolac), etc. Photoresist layer 60 may also be a dry photoresist that may be semi-solid film coated, laminated, etc. upon shorting layer 40. Exemplary dry photoresists are Asahi CX8040, Asahi CXA240, Riston photoresists, WBR photoresists.

Photoresist layer 60 is of sufficient thickness to form desired plating structures 70. As such, photoresist layer 60 may be chosen to be of a material and a thickness to satisfy such requirements. For example, photoresist layer 60 may have a thickness ranging from about 10 um to about 500 um, although a thickness less than 40 um and greater than 500 um have been contemplated. In one embodiment, photoresist layer 60 may be about 150 um to 175 um thick.

A pattern may be formed in the photoresist layer 60 by e.g. exposing portions of the photoresist layer 60 to radiation. Once the patterning of the photoresist is completed, portions of the photoresist layer 60 may be retained and portions of photoresist layer 60 may be etched away. The portions of photoresist layer 60 that are etched away may reveal the underlying shorting layer 40. In various embodiments, the portions of photoresist layer 60 that are etched away form trenches in which plating structures 70 are formed.

Plating structures 70 may be formed utilizing electrodeposition steps. Electrodeposition is a process in which, e.g. wafer 5 placed in the electroplating tool that contains a plating solution (e.g. plating bath, etc.). An electrical circuit is created when a negative terminal of a power supply is connected to wafer 5 (e.g. shorting layer 40, etc.) so as to form a cathode and a positive terminal of the power supply is connected to another metal in the container so as to form an anode. The plating material is typically a stabilized metal specie (e.g., a metal ion) in the plating solution. During the plating process this metal specie is replenished with a soluble metal that forms the anode and/or can be added, directly to the solution (e.g., as a metal salt, metal concentrate). When an electrical current is passed through the circuit, metal ions in the solution take-up electrons at the wafer 5 and metal is formed on the wafer 5. In certain embodiments, the metal is formed within the patterned trenches of photoresist layer 60 to form plating structures 70. In various embodiments, plating structures 70 may be utilized as wiring or contacts to transfer electrical current. In certain embodiments, plating structures 70 are C4 contact structures (e.g. solder bumps, pillars, etc.) that may utilized to interconnect the semiconductor device, chip, etc. to external circuitry.

Figure 3:
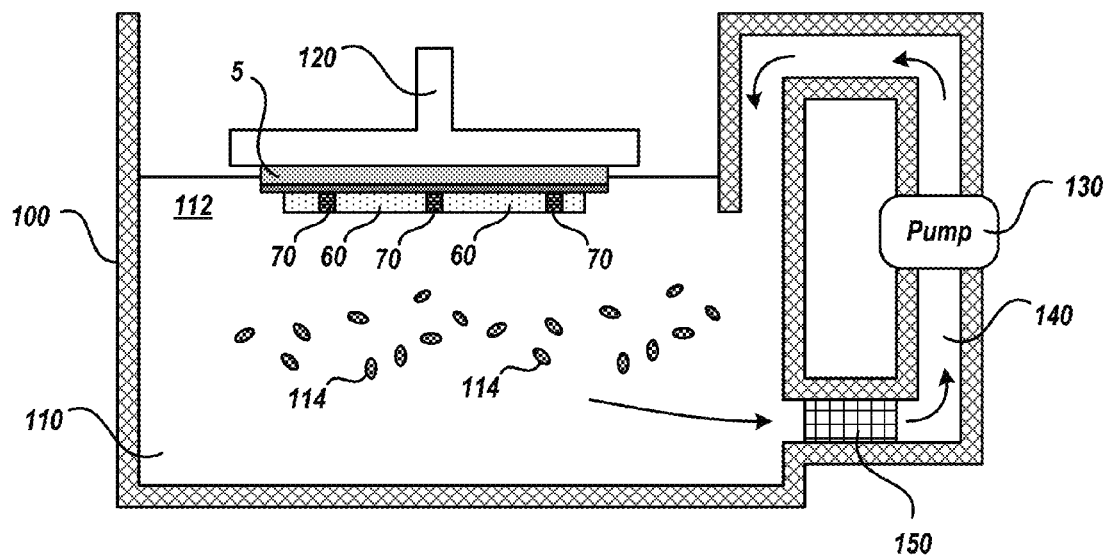
FIG. 3 depicts a photoresist stripping tool, in accordance with various embodiments of the present invention.

FIG. 3 depicts a photoresist stripping tool 100, in accordance with various embodiments of the present invention. Photoresist stripping tool 100 may include a reservoir 110 that contains photoresist stripping solution 112, a chuck 120, pump 130, conduit 140, and Pb filter 150. In various embodiments, wafer 5 may be attached to chuck 120 and placed into contact (e.g. immersed, partially immersed, etc.) with photoresist stripping solution 112. Chuck 120 may be rotated, agitated, or otherwise moved to promote the stripping of photoresist 60 from wafer 5.

In some embodiments, the photoresist stripping tool 100 may be utilized to strip photoresist 60 from a lead-free wafer 5 (e.g. pillar structures 70 are Pb free, etc.) and to strip photoresist 60 from a leaded wafer 5 (e.g. pillar structures 70 are not Pb free, etc.). Subsequent to stripping photoresist 60 from the leaded wafer 5, photoresist stripping solution 112 may contain Pb material 114. Pb material 114 may undesirably deposit onto shorting layer 55 and plating structures 70 when e.g. subsequently stripping photoresist 60 from the lead-free wafer 5. Such deposits undesirably prevent shorting layer 55 from being etched away, become incorporated into or upon the lead-free pillar structures 70, etc.

One solution to removing Pb material 114 from photoresist stripping solution 112 is to dump photoresist stripping solution 112 and cleaning photoresist stripping tool 100 prior to removing photoresist 60 from a lead-free wafer 5. Such solution leads to environmental waste and may not effectively result in removing all Pb material 114 from the photoresist stripping tool 100. For instance, testing has determined that a maximum of one week of photoresist removal processing through an un-cleaned photoresist stripping tool 100 could take place due to too high of a concentration of Pb material 114 that would result in re-deposition upon subsequently processed lead-free wafers 5.

Another solution is for the semiconductor device fabrication facility to utilize multiple photoresist removal tools. A first photoresist removal tool may be utilized to remove photoresist from lead-free wafers and a second photoresist removal tool may be utilized to remove photoresist from leaded wafers. Current photoresist stripping solutions cost between $55 and $75 per gallon and approximately eighteen gallons are needed for every three hundred wafers. If the wafers are segregated, only one third to one half of the number of wafers are otherwise able to be processes through the photoresist removal tool, equating to an approximate $3 per wafer cost addition. Further, current photoresist removal tools cost between two to three million dollars. Full segregation through different tools, allows for more robust usage of the tools, but results in at least one additional tool on the manufacturing floor, requiring additional capital.

Yet another solution, in accordance with the various embodiments of the present invention, is to react the photoresist stripping solution 112 with Pb filter 150 to remove the Pb material 114 (e.g. actively move photoresist stripping solution 112 across Pb filter 150, statically react photoresist stripping solution 112 with Pb filter 150, agitate photoresist stripping solution 112 with a Pb filter 150 additive, etc.). In the context of this document, removal of Pb material 114 generally means to reduce the Pb material 114 within photoresist stripping solution 112 below a threshold amount such that a monolayer of Pb does not form upon a portion of shorting layer 40 (e.g. a portion of the exposed copper layer, etc.) and/or a portion of plating structures 70. For example, Pb material 114 may be trapped, attached, deposited, etc. upon the Pb filter 150. In the various embodiments, of the present invention, Pb filter 150 removes Pb material 114 and includes a Tin (Sn) based filter element. An exemplary threshold amount may be 20 parts per million (ppm) of Pb material 114 within photoresist stripping solution 112. Another exemplary threshold amount may 2 ppm of Pb material 114 within photoresist stripping solution 112.

Certain photoresist stripping solutions 112 may be alkaline that results in corrosion of various exposed electrically conductive metals, such as copper (Cu), nickel (Ni), tin (Sn), aluminum (Al), gold (Ag), lead (Pb), etc. Further, in certain photoresist stripping solutions, Pb is more noble than Sn. Therefore, the Pb material 114 may be removed by the Pb material 114 oxidizing the Sn and depositing itself on the Sn surface of the Sn based filter element. In this manner, the Pb material 114 may be selectively removed from the photoresist stripping solution 112. As a result, lead-free wafers 5 and leaded wafers 5 can be stripped utilizing a similar photoresist stripping tool 100 and similar photoresist stripping solution 112. In certain embodiments, one or more lead-free wafers 5 and one or more leaded wafers 5 can be stripped simultaneously utilizing stripping tool 100. Reacting the photoresist stripping solution 112 with the Pb filter 150 to remove the Pb material 114 enables full use of the photoresist stripping solution 112 to remove photoresist 60 from leaded wafers 5 and from lead-free wafers 5 without the need to acquire additional tooling to segregate lead and lead free wafer processing.

In various embodiments, the Sn based filter element is a high surface-area Sn, Sn oxide, or Sn alloy structure incorporated into Pb filter 150. In various embodiments of the present invention, the Sn specie of the Sn based filter element is not fully oxidized. In other words, the Sn specie of the Sn based filter element is in an oxidation state of either 0 or 2 and not a full oxidation state of 4. Exemplary Sn based filter element materials may be Sn, SnO, Cu6Sn5, Cu3Sn, SnAg, SnBi, etc. For instance, the Sn specie of the Sn based filter element may be Sn. In such example, the Pb and Sn react as follows: $Pb^{2+}+Sn \rightarrow Pb+Sn^{2+}$. In another example, the Sn specie of the Sn based filter element may be SnO. In such example, the Pb and SnO react as follows: $Pb^{2+}+2OH^{-}+SnO \rightarrow Pb+SnO_2+H_2O$. In other words, the Pb oxidizes Sn specie of the Sn based filter element and attaches, is deposited, or otherwise is fixed upon the surface of the Sn based filter element. In this manner, the Pb material 114 may be effectively removed from photoresist stripping solution 112 by reacting the photoresist stripping solution 112 with the Pb filter 150.

In certain embodiments, the photoresist stripping tool may further include pump 130 and conduit 140. Pump 130 actively circulates, flows, or otherwise moves photoresist stripping solution 112. In certain embodiments, the pump 130 circulates the photoresist stripping solution 112 utilizing conduit 140. Conduit 140 transfers photoresist stripping solution 112 and may include an inlet to accept photoresist stripping solution 112 and an outlet to return photoresist stripping solution 112 to reservoir 110. In various embodiments, Pb filter 150 may be included within or otherwise between the inlet and outlet of conduit 140.

Figure 4:
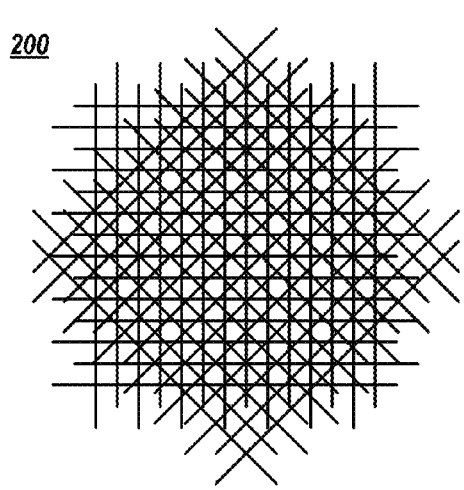
FIG. 4-FIG. 6 depict a Tin (Sn) based filter element, in accordance with various embodiments of the present invention.

FIG. 4 depicts an exemplary Sn based filter element 200, in accordance with various embodiments of the present invention. Sn based filter element 200 is a high surface area Sn specie mesh surface. For instance, Sn based filter element 200 may be multiple layers of Sn specie screen or mesh. In another example, Sn based filter element 200 may be a Sn specie mesh membrane within a tubular filter module, plate and frame filter module, etc. In certain embodiments, the Sn specie forms an outer surface of the Sn based filter element 200. In other words, the Sn based filter element 200 may include an inner structure such as mesh, screen, etc. of e.g. Titanium, Cu, etc. onto which a Cu, Sn or Sn alloy metal may be deposited and may be further transformed to form the Sn specie outer mesh surface (e.g. immersion of Sn onto the backbone Cu, oxidation to transform the Sn to SnO, etc). In various embodiments of the present invention, Sn based filter element 200 is included within Pb filter 150.

Figure 5:
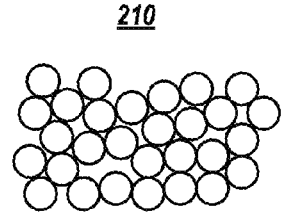
Figure 9:
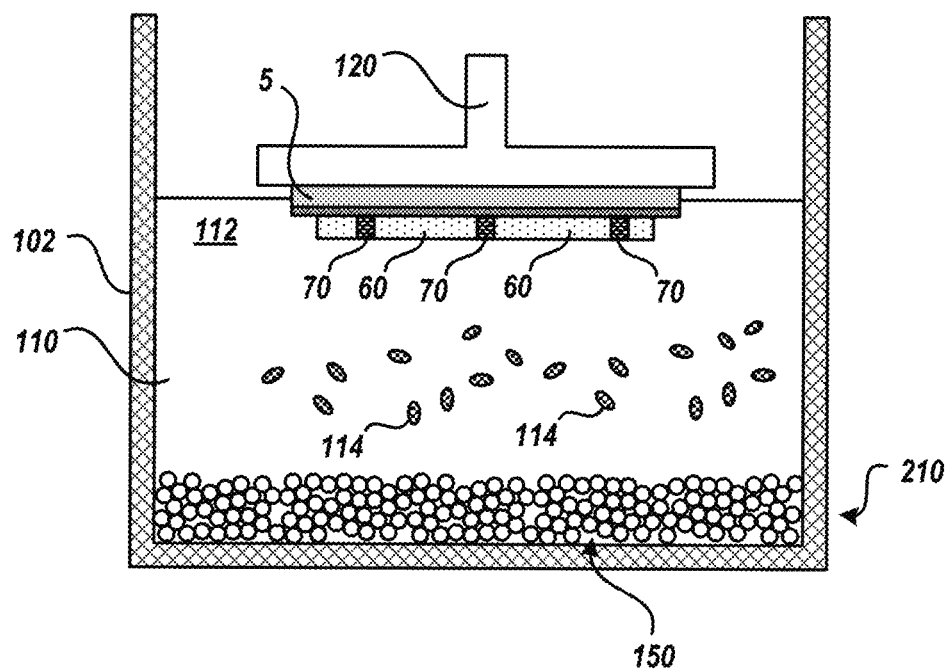
FIG. 9 depicts a photoresist stripping tool, in accordance with various embodiments of the present invention.

FIG. 5 depicts another exemplary Sn based filter element 210, in accordance with various embodiments of the present invention. Sn based filter element 210 is an ion-exchange matrix. For example, Sn based filter element 210 is a bed of numerous Sn specie beads, Sn specie spheres, or other Sn specie particulates. In various embodiments, the Sn based filter element 210 traps ions. For example, the Sn specie exchanges the Pb ions as follows: $Pb^{2+}+Sn \rightarrow Pb+Sn^{2+}$. In various embodiments of the present invention, Sn based filter element 210 is included within Pb filter 150. In some embodiments of the present invention, as is shown in FIG. 9, Sn based filter element 210 may be utilized as Pb filter 150 and included within reservoir 110 of a static photoresist stripping tool 102 as an ion-exchange bed matrix. The static photoresist stripping tool 102 includes a reservoir 110 that contains photoresist stripping solution 112 that is not actively moved, circulated, flowed, etc. by pump 130. In certain embodiments, static photoresist stripping tool 102 includes an agitation device, such as vibration device, oscillator device, rotation device, etc. to promote the Pb material 114 to react with the Pb filter 150.

Figure 6:

FIG. 6 depicts another exemplary Sn based filter element 220, in accordance with various embodiments of the present invention. Sn based filter element 220 is a high surface area Sn specie wire surface. For example, Sn based filter element 220 may be multiple strands of Sn specie wire formed into a specific diameter or shape. In another example, Sn based filter element 220 may be a wire surface utilized in a spiral-wound filter module. In some embodiments, the Sn based filter element 220 may include an inner wire etc. of e.g. Titanium, Cu, etc. onto which a Cu, Sn or Sn alloy metal may be deposited and may be further transformed to form the Sn specie outer wire surface. In various embodiments of the present invention, Sn based filter element 220 is included within Pb filter 150.

Figure 7:
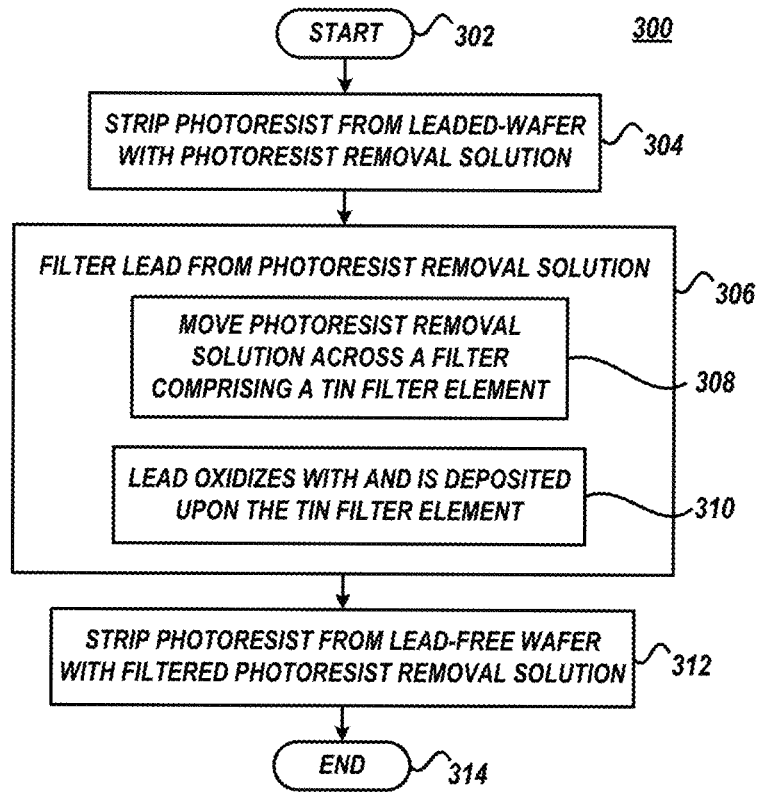
FIG. 7 depicts an exemplary semiconductor wafer photoresist stripping process, in accordance with various embodiments of the present invention.

FIG. 7 depicts an exemplary semiconductor wafer photoresist stripping process 300, in accordance with various embodiments of the present invention. In some embodiments, semiconductor wafer photoresist stripping process 300 may be utilized to remove photoresist 60 from lead-free wafer 5 and to remove photoresist 60 from a leaded wafer 5 with photoresist stripping solution 112 that contains Pb material 114. Process 300 begins at block 302 and continues with stripping photoresist 60 from leaded wafer 5 with photoresist removal solution 112 (block 304).

Process 300 may continue with filtering Pb material 114 from the photoresist removal solution 112 (block 306). In certain embodiments, such when utilizing a photoresist stripping tool 100, the photoresist removal solution 112 is actively moved or otherwise flowed across Pb filter 150 that includes a Sn based filter element (e.g. Sn based filter element 200, Sn based filter element 210, Sn based filter element 220, etc.) (block 308). Process 300 may continue with the Pb material 114 oxidizing the Sn specie of the Sn based filter element becoming attached, deposited, or otherwise is fixed upon the surface of the Sn based filter element (block 310). For example, the Pb material 114 may deposit upon the Sn specie of the Sn based filter element as photoresist removal solution 112 is actively moved across Pb filter 150. In another example, the Pb material 114 may deposit upon the Sn specie of Sn based filter element 210 upon the Pb material 114 reacting with the Sn specie in photoresist stripping tool 102. In this manner, the Pb material 114 may be selectively removed from the photoresist stripping solution 112.

Process 300 may continue with stripping photoresist 60 from a lead-free wafer 5 with the filtered photo resist stripping solution 112 (block 312). In other words, lead-free wafers 5 and leaded wafers 5 can be stripped utilizing a similar photoresist stripping tool 100, 102 and similar photoresist stripping solutions 112. In certain embodiments, the photoresist 60 of one or more lead-free wafers 5 is stripped subsequent to the stipping of photoresist 60 of a leaded wafer 5. In other embodiments, the photoresist 60 is stripped from one or more leaded wafers 5 and one or more lead-free wafers is stripped simultaneously. Process 300 allows for use of the photoresist stripping solution 112 to remove photoresist 60 from leaded wafers 5 and from lead-free wafers 5 without the need to acquire additional tooling to segregate lead and lead free wafer processing. Process 300 ends at block 314.

Figure 8:
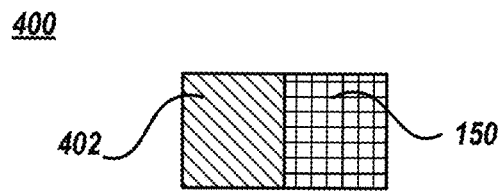
FIG. 8 depicts a multistage filter, in accordance with various embodiments of the present invention.

FIG. 8 depicts a multistage filter 400, in accordance with various embodiments of the present invention. Multistage filter 400 includes at least a first filter stage comprising Pb filter 150 and at least a second filter stage comprising particulate filter 402. The various stages of multistage filter 400 may be arranged in series or in parallel. Particulate filter 402 may be configured to remove other particulates contained within photoresist stripping solution 112. For example, particulate filter 402 may remove other more noble species, such as Cu, from photoresist stripping solution 112 that are also deposited upon lead-free wafers 5 in association with the stripping of photoresist 60. The removal of the other more noble species generally means to reduce other more noble species within photoresist stripping solution 112 to below a threshold.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

The invention claimed is:

1. A photoresist stripping tool comprising:
   a reservoir comprising a photoresist stripping solution;
   a Lead (Pb) free semiconductor wafer and a leaded semiconductor wafer simultaneously within the reservoir, wherein Pb from the leaded semiconductor wafer corrodes into the photoresist stripping solution;
   a Pb filter within the reservoir that removes Pb from the photoresist stripping solution, the Pb filter comprising a mesh filter element comprising an inner Copper structure and Tin (Sn) specie exterior surfaces; and
   Pb from the photoresist stripping solution deposited upon the Sn specie exterior surfaces of the mesh filter element.

2. The photoresist stripping tool of claim 1, wherein the Sn specie is pure Sn.

3. The photoresist stripping tool of claim 1, wherein the Sn specie has an oxidation state of 2.

4. The photoresist stripping tool of claim 1, further comprising:
   a conduit in contact with the reservoir, the conduit comprising an inlet to accept the photoresist stripping solution from the reservoir and an outlet to return the photoresist stripping solution to the reservoir, and;
   a pump to move the photoresist stripping solution via the conduit.

5. The photoresist stripping tool of claim 4, wherein the Pb filter is comprised between the inlet and the outlet.

6. The photoresist stripping tool of claim 1, wherein the Pb filter comprises a plurality of mesh filter elements.

7. A semiconductor wafer fabrication system comprising:
   a Lead (Pb) free semiconductor wafer and a leaded semiconductor wafer within a reservoir of a photoresist stripping tool that simultaneously strips photoresist from the Pb free semiconductor wafer and the leaded semiconductor wafer, wherein Pb from the leaded semiconductor wafer corrodes into the photoresist stripping solution, the photoresist stripping tool comprising:
   the reservoir that contains a photoresist stripping solution;
   a Pb filter within the reservoir that removes Pb from the photoresist stripping solution, the Pb filter comprising a mesh filter element comprising an inner Titanium structure and Tin (Sn) specie exterior surfaces; and
   Pb from the photoresist stripping solution deposited upon the Sn specie exterior surfaces of the mesh filter element.

8. The semiconductor wafer fabrication system of claim 7, wherein the Sn specie is pure Sn.

9. The of claim 7, wherein the Sn specie has an oxidation state of 2.

10. The semiconductor wafer fabrication system of claim 7, wherein the photoresist stripping tool further comprises:
    a conduit in contact with the reservoir, the conduit comprising an inlet to accept the photoresist stripping solution from the reservoir and an outlet to return the photoresist stripping solution to the reservoir, and;
    a pump to move the photoresist stripping solution via the conduit.

11. The semiconductor wafer fabrication system of claim 10, wherein the Pb filter is comprised between the inlet and the outlet.

12. The semiconductor wafer fabrication system of claim 7, wherein the Pb filter comprises a plurality of mesh filter elements.

13. The photoresist stripping tool of claim 1, wherein a concentration of Pb within the photoresist stripping solution is below a predetermined Pb concentration threshold such that a monolayer of Pb does not form upon the Pb free semiconductor wafer and does not form upon the leaded semiconductor wafer.

14. The semiconductor wafer fabrication system of claim 7, wherein a concentration of Pb within the photoresist stripping solution is below a predetermined Pb concentration threshold such that a monolayer of Pb does not form upon the Pb free semiconductor wafer and does not form upon the leaded semiconductor wafer.

15. The photoresist stripping tool of claim 1, wherein Pb oxidizes the Sn specie exterior surface of the mesh filter element and Pb is deposited upon the mesh filter element.

16. The semiconductor wafer fabrication system of claim 7, wherein Pb oxidizes the Sn specie exterior surfaces of the mesh filter element and Pb is deposited upon the mesh filter element.

17. The photoresist stripping tool of claim 1, wherein the Sn specie is $Cu_6Sn_5$.

18. The photoresist stripping tool of claim 1, wherein the Sn specie is $Cu_3Sn$.

19. The photoresist stripping tool of claim 1, wherein the Sn specie is SnAg.

20. The photoresist stripping tool of claim 1, wherein the Sn specie is SnBi.

* * * * *